(12) United States Patent
Takasu et al.

(10) Patent No.: US 6,387,762 B2
(45) Date of Patent: May 14, 2002

(54) METHOD OF MANUFACTURING FERROELECTRIC MEMORY DEVICE

(75) Inventors: Hidemi Takasu; Takashi Nakamura, both of Kyoto (JP)

(73) Assignee: Rohm Co., LTD, Kyoto (JP)

( * ) Notice: Subject to any disclaimer, the term of this patent is extended or adjusted under 35 U.S.C. 154(b) by 0 days.

(21) Appl. No.: 09/791,616

(22) Filed: Feb. 26, 2001

(30) Foreign Application Priority Data

Feb. 24, 2000 (JP) ........................................ 2000-047782

(51) Int. Cl.[7] ...................... H01L 21/336; H01L 29/792
(52) U.S. Cl. .......................... 438/287; 438/3; 257/324
(58) Field of Search ...................... 438/3, 287; 257/324

(56) References Cited

U.S. PATENT DOCUMENTS

2001/0028582 A1 * 10/2001 Tarui et al. ................. 365/200

FOREIGN PATENT DOCUMENTS

JP          10-223845 A    *  8/1998    ........... H01L/27/04

* cited by examiner

*Primary Examiner*—Charles Bowers
*Assistant Examiner*—Erik Kielin
(74) *Attorney, Agent, or Firm*—Rader, Fishman & Grauer, PLLC

(57) ABSTRACT

A method of manufacturing a ferroelectric memory device which has a gate structure constituted by a ferroelectric layer and a conductor layer stacked on a semiconductor substrate. The method includes steps of forming the gate structure section by patterning the ferroelectric layer and the conductor layer through etching using a common mask layer, introducing impurities into the semiconductor substrate in a self-aligning manner with respect to the gate structure section, and annealing simultaneously both of the ferroelectric layer and the impurities introduced into the conductor substrate to crystallize the ferroelectric layer and at the same time activate the impurities thereby to form a pair of impurity diffused layers.

8 Claims, 3 Drawing Sheets

METHOD OF MANUFACTURING FERROELECTRIC MEMORY DEVICE

BACKGROUND OF THE INVENTION

1. Field of the Invention

The present invention relates to a method of manufacturing a ferroelectric memory device capable of nonvolatile data storage utilizing a polarization of a ferroelectric layer.

2. Description of Related Arts

A ferroelectric memory device is a nonvolatile memory device in which a ferroelectric layer is used. When an electric field is applied to a ferroelectric layer, a polarization becomes complete in the ferroelectric layer, and the direction of the polarization is retained even after removing the electric field. By utilizing this, nonvolatile data storage can be performed.

FIG. 2 is a schematically sectional view showing the most basic structure of a ferroelectric memory element. A gate structure is formed, in which a ferroelectric layer 5 (F) and a metal layer 6 (M) as a gate electrode are stacked on the surface of a silicon substrate 1 (S). A pair of N-type diffused layers 2, 2 serving as a source and a drain are formed with the gate structure interposed therebetween. Thereby a MIS transistor using a ferroelectric layer as an insulating layer is fabricated.

By applying a voltage of, e.g. 5V between the metal layer 6 and the silicon substrate 1, an electric field oriented in a direction from the metal layer 6 toward the silicon substrate 1 or from the silicon substrate 1 toward the metal layer 6 is applied to the ferroelectric layer 5. This forms, in the ferroelectric layer 5, a polarization aligned with the direction of the applied electric field. The polarization is retained after removing the electric field applied between the metal layer 6 and the silicon substrate 1.

As a result, the surface of the silicon substrate 1 between the N-type diffused layers 2, 2 takes a state in which electrons are induced and a state in which holes are induced. Thereby, the threshold value of a voltage to be applied to the metal layer 6 for making conductive the pair of the N-type diffused layers 2, 2 changes between two kinds, namely, "high" and "low" in accordance with the direction of the polarization of the ferroelectric layer 5. Therefore, binary data of "0" or "1" can be stored in a nonvolatile manner.

In the structure shown in FIG. 2, it is difficult to form a satisfactorily crystallized ferroelectric layer 5 on the silicon substrate 1. Further, this structure has another problem that the ferroelectric material is diffused in the silicon substrate 1. Accordingly, it has been proposed that another insulating layer 3 (I) is interposed between the silicon substrate 1 and the ferroelectric layer 5 as shown in FIG. 3.

In the structure shown in FIG. 3, it is necessary to obtain a favorable alignment in the surface boundary between the silicon substrate 1 and the insulating layer 3 and at the same time obtain a favorable alignment between the insulating layer 3 and the ferroelectric layer 5. Therefore, this structure has a problem that the material of the insulating layer 3 and the method for forming the same is strictly limited. Further, the insulating layer 3 does not have a satisfactory barrier effect for preventing the diffusion of the ferroelectric material.

On the other hand, in FIG. 4, a structure of a ferroelectric memory element is shown in which a metal layer 4 (M) is interposed between the insulating layer 3 and the ferroelectric layer 5 to form a gate structure. In this structure, since the alignment in the surface boundary between the insulating layer 3 and the ferroelectric layer 5 need not be considered, a satisfactorily crystallized insulating layer 3 can be formed on the silicon substrate 1 and at the same time, the ferroelectric layer 5 can be satisfactorily crystallized. Further, the metal layer 4 can prevent the diffusion of the ferroelectric material.

However, both of the structures shown in FIGS. 3 and 4 have the following problem in the manufacturing process thereof. The pair of N-type diffused layers 2, 2 serving as a source and a drain are formed by implanting N-type impurity ions in the silicon substrate 1 and thereafter activating the N-type impurities implanted in the surface of the silicon substrate 1 through activated annealing. The activated annealing comprises heating the silicon substrate 1 at a temperature of 900 to 950° C. in a furnace for 1 to 2 hours. However, when the ferroelectric layer 5 is subjected to such a heat treatment, the polarization characteristics of the ferroelectric layer 5 are deteriorated.

In order to avoid this disadvantage, for example, a process of fabricating a MFMIS structure shown in FIG. 4 is required to comprise steps of fabricating a MIS transistor section, then activating the pair of N-type impurity diffused layers 2, 2, and thereafter forming a capacitor section in which the ferroelectric layer is interposed between the metal layers 4, 6.

FIG. 5 is a schematically sectional view for explaining a practical structural example of a ferroelectric memory element having the structure shown in FIG. 4. In this ferroelectric memory element, an insulating layer 3 and a metal layer 4a are stacked on the surface of the silicon substrate 1 to form a MIS gate structure, and a pair of N-type diffused layers 2, 2 are formed on both sides of the MIS gate structure respectively. Then, after the pair of N-type diffused layers are activated by activated annealing, a capacitor structure comprising a metal layer 4b, a ferroelectric layer 5 and a metal layer 6 is formed in a different position from that of the MIS transistor. And a connecting section 7 comprising wiring layers and plugs connects the metal layer 4a of the MIS transistor and the metal layer 4b on the capacitor side.

A disadvantage of the structure shown in FIG. 5 is that since the transistor section and the capacitor section are formed in the separate regions, the area occupied by a memory cell on the silicon substrate 1 becomes large and high level integration is hard to attain.

This disadvantage is somewhat decreased by adopting the structure shown in FIG. 6. In the structure shown in FIG. 6, a large-sized insulating layer 3 and a similarly large-sized metal layer 4 are stacked on a silicon substrate 1 to form a MIS structure, and thereafter, N-type impurities are implanted in the silicon substrate 1 and activated by annealing to form a pair of N-type diffused layers 2, 2 in the surface layer section of the silicon substrate 1. Then, a ferroelectric layer 5 and a metal layer 6 are formed and stacked in order on the silicon substrate 1.

When this structure is adopted, the area of the gate structure section in which the insulating layer 3 and the metal layer 4 are stacked is required to be larger than the area of the structure section in which the ferroelectric layer 5 and the metal layer 6 is stacked. This is so because it is necessary to secure a margin between a mask for patterning the gate structure section in which the insulating layer 3 and the metal layer 4 are stacked and a mask for patterning the structure section in which the ferroelectric layer 5 and the metal layer 6 are stacked.

Thus, when the structure shown in FIG. 6 is adopted, a large-sized area of gate structure section is also required. Therefore, in this case, the attainment of high level integration is limited.

SUMMARY OF THE INVENTION

An object of the present invention is to provide a method of manufacturing a ferroelectric memory device capable of advantageously attaining high level integration.

A method of manufacturing a ferroelectric memory device according to the present invention comprises steps of stacking a ferroelectric layer and a conductor layer on a semiconductor substrate in order, forming a gate structure section including the ferroelectric layer and the conductor layer by patterning the ferroelectric layer and the conductor layer through etching using a common mask layer, introducing impurities into a pair of regions spaced apart from each other with the gate structure section interposed therebetween in a surface layer section of the semiconductor substrate in a self-aligning manner with respect to the gate structure section, and annealing simultaneously both of the ferroelectric layer and the impurities introduced into the conductor substrate to crystallize the ferroelectric layer and at the same time activate the impurities so as to form a pair of impurity diffused layers in the pair of regions respectively.

According to the present invention, the gate structure section comprising the ferroelectric layer and the conductor layer is formed through a manufacturing process including the etching step using the common mask layer. And impurities are introduced into the semiconductor substrate in a self-aligning manner with respect to the gate structure section.

Accordingly, a transistor comprising the gate structure section including the ferroelectric layer and the conductor layer, and the impurity diffused regions formed with the gate structure interposed therebetween can be formed in a small area.

The impurities introduced into the semiconductor substrate are activated by annealing, whereby a pair of impurity diffused layers are formed with the gate structure section interposed therebetween. In this annealing step, the ferroelectric layer is crystallized at the same time.

According to the present invention, annealing for crystallizing the ferroelectric layer and annealing for activating the impurity ions are performed in a common step as abovementioned. As a result, the ferroelectric layer can be prevented from being deteriorated. Further, since the annealing of the semiconductor substrate can be completed only by once, heat damage to the semiconductor substrate can be reduced. Accordingly, the characteristics of the ferroelectric memory device can be improved. In addition, the manufacturing process can be simplified.

An advantage of this invention is that the crystallization of the ferroelectric layer and the activation of the impurities are performed in a common annealing step. By adopting such a step, the ferroelectric layer and the conductor layer constituting the gate structure section can be patterned by etching using a common mask layer, and though the impurity diffused layers are formed in a self-aligning manner using the gate structure section formed as abovementioned, the characteristics of the ferroelectric layer can be prevented from being deteriorated.

It is preferable that a method of manufacturing a ferroelectric memory device according to the present invention further comprises a step of forming an insulating layer on the semiconductor substrate before forming the ferroelectric layer.

According to this method, an insulating layer is interposed between the ferroelectric layer and the surface of the semiconductor substrate, and therefore, a gate structure section having a MFIS structure (see FIG. 3) can be formed.

Further, the method may further comprises a step of forming a different conductor layer after forming the insulating layer and before forming the ferroelectric layer, and this different conductor layer may be formed between the insulating layer and the ferroelectric layer.

According to this method, a gate structure section having so-called a MFMIS structure (see FIG. 4) can be formed. In this case, it is preferable to pattern the pair of conductor layers and the ferroelectric layer interposed therebetween using the common mask layer.

The annealing step for crystallizing the ferroelectric layer and activating the impurities preferably comprises lamp annealing. Thereby, the characteristics of the ferroelectric layer can be prevented from being deteriorated, unlike a case of the conventional activated annealing performed in a furnace. When the impurity diffused layers form a so-called shallow junction, the impurities implanted into the semiconductor substrate are sufficiently activated by a short time heat treatment such as lamp annealing, to form favorable impurity diffused layers.

The time period and the temperature of the lamp annealing are preferably determined on the basis of the material constituting the ferroelectric layer and the distance between the pair of the impurity diffused layers. That is, the conditions for performing the lamp annealing are adequately determined on the basis of the material of the ferroelectric layer and the channel length, so that both of the crystallization of the ferroelectric layer and the activation of the impurities implanted into the semiconductor substrate can be satisfactorily performed at the same time in the common annealing step.

The foregoing and other objects, features, aspects and advantages of the present invention will become more apparent from the following detailed description of the present invention given with reference to the accompanying drawings.

DESCRIPTION OF THE PREFERRED EMBODIMENTS

FIGS. 1A to 1D are sectional views for explaining a method of manufacturing a ferroelectric memory device according to an embodiment of the present invention. In this manufacturing process, a ferroelectric memory element having a gate structure of so-called MFMIS type is formed.

Figure 1A:
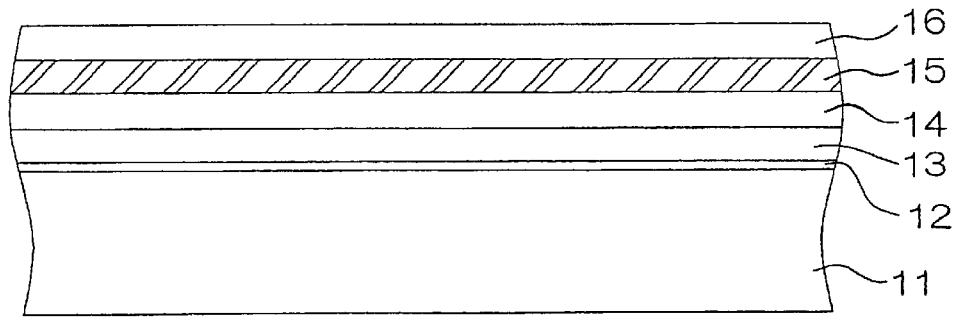
FIGS. 1A to 1D are sectional views showing steps of manufacturing a ferroelectric memory device according to an embodiment of the present invention in order.

Firstly, as shown in FIG. 1A, a silicon oxide layer 12 as an insulating layer, a polysilicon layer 13, a lower electrode layer 14 (a conductor layer), a ferroelectric layer 15 and an upper electrode layer 16 (another conductor layer) are stacked in this order and formed on a surface of a silicon substrate 11 (a semiconductor substrate).

The silicon oxide layer 12 can be formed by heat-oxidizing the surface of the silicon substrate 11. The polysilicon layer 13 can be formed by a reduced pressure CVD (chemical vapor deposition) method using silane gas and hydrogen gas as material gases. The polysilicon layer 13 is made to have a low resistance by introducing impurities such as phosphorus or the like therein.

The lower electrode layer 14 and the upper electrode layer 16 are conductor layers made of metal and can be formed by sputtering. The lower electrode layer 14 is preferably formed of a material having a high barrier effect preventing diffusion of the ferroelectric material, and an iridium layer, an iridium oxide layer or a laminate layer consisting of an iridium layer and an iridium oxide layer, for example, can be applied. Similarly, the upper electrode layer 16 can be formed of, for example, an iridium layer, an iridium oxide layer or a laminate layer consisting of an iridium layer and an iridium oxide layer. In addition, the lower electrode layer 16 and the upper electrode layer 14 can be formed of a platinum layer or a laminate layer consisting of a platinum layer and an iridium layer.

Figure 1B:
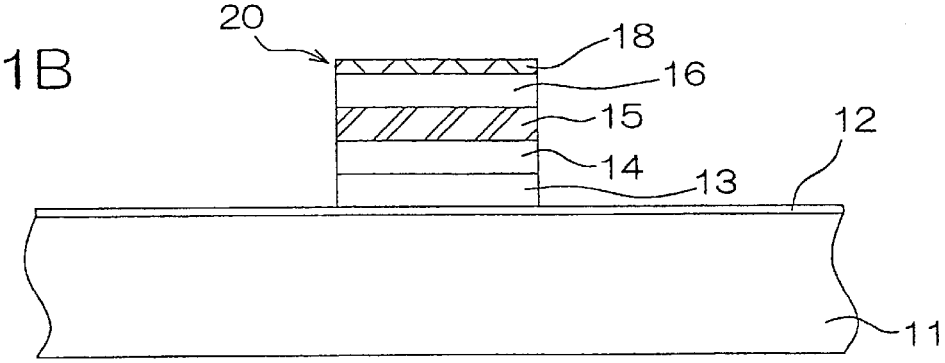

The ferroelectric layer 15 is a layer formed of an ferroelectric material such as PZT ($Pb(Zr,Ti)O_3$), SBT ($SrBi_2Ta_2O_9$) or STN ($Sr_2(Ta,Nb)_2O_7$) and having a thickness of 1000 Å to 2000 Å, and it can be stacked on the surface of the lower electrode layer 14 using, for example, a sol-gel method, a sputter method, a MOCVD method (metal organic chemical vapor deposition), a laser abrasion method, a pulsed laser deposition method or the like. Immediately after stacked on the lower electrode 14, the ferroelectric layer 15 has not been crystallized yet. Then, as shown in FIG. 1B, a mask layer 18 for forming a gate structure section 20 is patterned on the surface of the upper electrode layer 16. The mask layer 18 is preferably formed of a hard mask layer of, for example, silicon oxide, titanium nitrate, alumina or the like.

Using the mask layer 18 in common, patterning of all the layers constituting the gate structure section 20 (except the silicon oxide layer 12) is performed by etching. That is, the upper electrode layer 16, the ferroelectric layer 15, the lower electrode layer 14 and the polysilicon layer 13 are etched by dry etching in this order. By changing over the gas used in etching each layer, the etching can be satisfactorily performed with ensuring the uniformity in the wafer surfaces. For example, a gas including chlorine is used in etching the upper electrode layer 16 and the lower electrode layer 14, and a gas including fluorine is used in etching the ferroelectric layer 15, while a gas including HBr or a mixed gas including chlorine and fluorine is used in etching the polysilicon layer 13.

By changing over the gas used in etching each layer as abovementioned, uniform etching can be performed in plural gate structures 20 formed in a wafer surface. Further, it is preferable to remove the residue at need after completing the etching of one layer or more than one layers.

Though the polysilicon layer 13 can be etched with a gas including chlorine, the upper electrode layer 16 and the lower electrode layer 14 are etched at the same time with the polysilicon layer 13 when a gas including chlorine is used. Accordingly, it is preferable to use a gas including fluorine or a mixed gas including fluorine and chlorine. Further, it is more preferable to use a gas including HBr in etching the polysilicon layer 13. The etching of the polysilicon layer 13 using a gas including HBr enables to perform the patterning of the polysilicon layer 13 without giving damage to the silicon oxide layer 12, because the etching selection ratio of the polysilicon layer 13 in relation to the silicon oxide layer 12 is large.

By etching the upper electrode layer 16, ferroelectric layer 15, the lower electrode layer 14 and the polysilicon layer 13 in order using the mask layer 18 in common as abovementioned, the gate structure section 20 shown in FIG. 1B can be formed on the silicon substrate 11. Since each layer is patterned using the common mask layer 18 to form the gate structure section 20, it is not necessary to take a margin between plural masks into consideration. Accordingly, the gate structure section 20 can be formed on a small area.

Figure 1C:
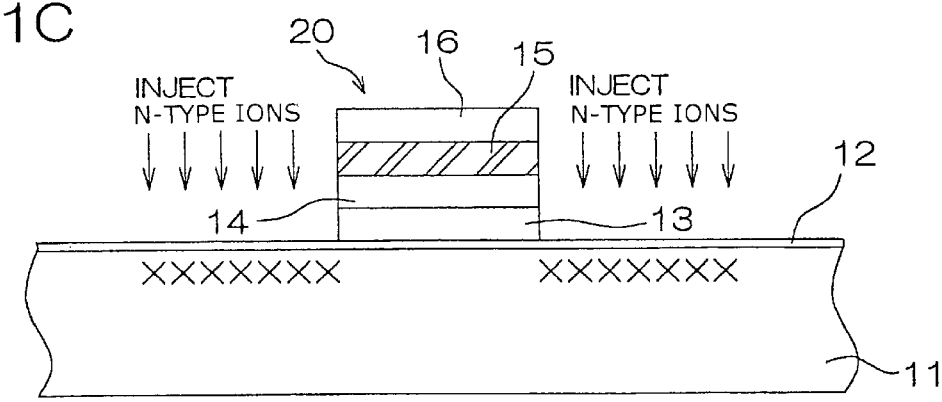

Then, as shown in FIG. 1C, after removing the mask layer 18 at need, arsenic ions as N-type impurities, for example, are injected into the silicon substrate 11 in a self-aligning manner with respect to the gate structure section 20. In FIG. 1C, the N-type impurity ions injected into the outer layer of the silicon substrate 11 are shown with marks "X".

Figure 1D:
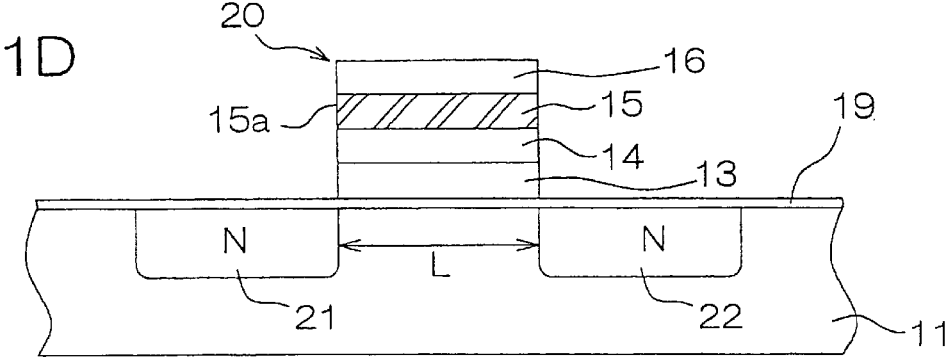

Thereafter, lamp annealing is performed. By this lamp annealing, the N-type impurity ions injected into the outer layer of the silicon substrate 11 are activated, so that a pair of N-type impurity diffused layers 11, 12, which are spaced from each other with the gate structure section 20 therebetween, are formed as shown in FIG. 1D. At the same time with this, heating for the crystallization of the ferroelectric layer 15 is also performed.

Treating conditions used in the lamp annealing step are adequately determined in accordance with the channel length L of the gate structure section 20, namely, the distance between the pair of the N-type impurity diffused layers 21, 22, and the kind of the ferroelectric material constituting the ferroelectric layer 15. For example, when the channel length L is about 0.18 µm, that is, the design rule is about 0.18 µm and the ferroelectric layer 15 is formed of STN (its crystallization temperature: 900 to 1100° C.), the impurities injected into the surface layer section of the silicon substrate 11 can be satisfactorily activated and at the same time the ferroelectric layer 15 can be satisfactorily crystallized by performing the lamp annealing for about 1 second to a few seconds under a temperature of about 1050° C. When a minute gate structure section 20 having a channel length of about 0.18 µm is formed, the pair of N-type impurity diffused layers 21, 22 form a so-called shallow junction, which can be completely activated by such a momentary heating treatment in a sense as abovementioned.

As a material of the ferroelectric layer 15, PZT and SBT can be additionally exemplified. These materials have crystallization temperatures of about 550 to 800° C. and about 750 to 900° C., respectively. The temperature and the time period employed in the lamp annealing are preferably determined with taking such a crystallization temperature of the material of the ferroelectric layer 15 into consideration. However, when the temperature of the heat applied to the silicon substrate 11 in the annealing step is higher than the abovementioned crystallization temperature, the amount of the heat applied to the ferroelectric layer 15 is adjusted by shortening the time period of the lamp annealing step, so that the ferroelectric layer 15 can be satisfactorily crystallized.

The atmosphere in which the lamp annealing is performed will be described here. Generally, activated annealing for activating impurity ions injected into a semiconductor substrate is performed in a nitrogen atmosphere so as to prevent oxidization of the surface boundary. On the other hand, annealing for crystallizing a ferroelectric layer is generally performed in an oxygen atmosphere so as to prevent dissipation of oxygen from the ferroelectric layer. This is so because a ferroelectric material is generally formed of an oxide, and therefore its characteristics are degraded if oxygen is dissipated therefrom.

In this embodiment, the lamp annealing is performed, for example, in an oxygen atmosphere. The reason is that the surface of the silicon substrate 11 at the time of the annealing is covered with the silicon oxide layer 12 and therefore, it is not necessary to take oxidization of the surface of the silicon substrate 11 into consideration. In addition, since only an extremely short time heat treatment is performed in the annealing, unlike a heat treatment in a furnace, it is not necessary to take oxidization by heat into consideration.

It is preferable to perform the lamp annealing in an oxygen atmosphere in order to maintain the characteristics of the ferroelectric layer 15. However, when the ferroelectric layer 15 abundantly includes oxygen from the beginning, the lamp annealing can be performed in a nitrogen atmosphere. Further, the lamp annealing can be performed in an atmosphere of a mixed gas consisting of nitrogen and oxygen.

The silicon oxide layer 12 is damaged at the time of the ion injection. Accordingly, it is preferable to remove the silicon oxide layer 12 by wet etching after performing the annealing, and then to form a new silicon oxide layer 19 by oxidization of the surface of the silicon substrate 11.

Figure 5:
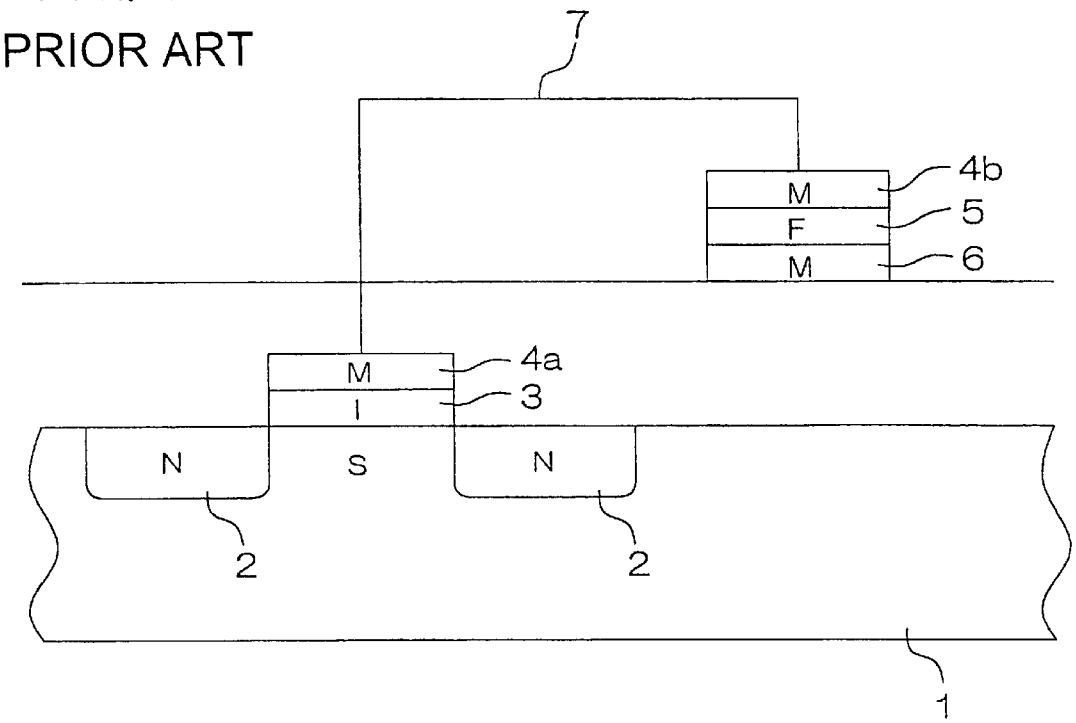
FIG. 5 is a schematically sectional view showing an example of a conventional structure in which a transistor section and a capacitor section are formed in separate positions to fabricate substantially a MFMIS type ferroelectric memory element.
Figure 6:
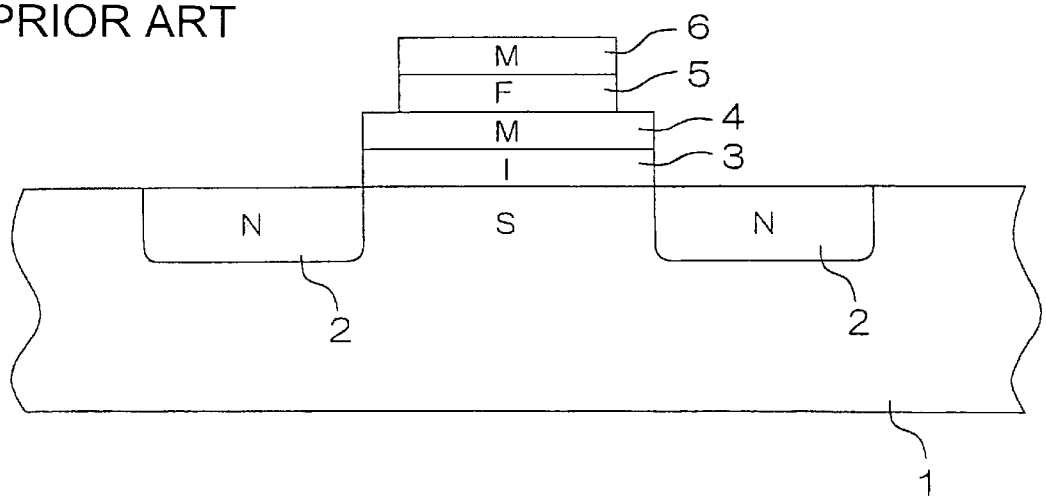
FIG. 6 is a schematically sectional view showing an example of a conventional structure in which a capacitor section is stacked on a transistor section to fabricate a MFMIS type ferroelectric memory element.

According to the method of manufacturing ferroelectric memory device of this embodiment, the plural layers constituting the gate structure section 20 including the upper electrode layer 16 and the ferroelectric layer 15 are patterned using the common mask layer 18, as abovementioned. Thereby the gate structure section 20 can be extremely minimized, unlike the abovementioned conventional art in which a transistor section and a capacitor section are formed in separate manufacturing processes (see FIGS. 5 and 6). As a result, a ferroelectric memory device of high level integration can be realized.

Further, by implanting N-type impurity ions in the silicon substrate 11 in a self-aligning manner with respect to the gate structure 20 and then activating the same through lamp annealing, the pair of N-type impurity diffused layers 21, 22 are formed with a interposition of the gate structure section 20 therebetween. The transistor area can be also minimized by this, a ferroelectric memory device of high level integration can be realized.

Further, according to the method of this embodiment, instead of activating the impurities injected into the silicon substrate 11 after crystallizing the ferroelectric layer 15, the heat treatment for both of activating the impurities and crystallizing the ferroelectric layer 14 is achieved by the common lamp annealing. Therefore, a ferroelectric layer 15 having favorable characteristics can be obtained, so that a ferroelectric memory device having excellent memory characteristics can be realized. In addition, since the ferroelectric layer 15 is etched using the mask layer 18 and thereafter crystallized, the crystallization of the end face 15a of the ferroelectric layer 15 is also satisfactory. Accordingly, current leakage from the edge portion of the ferroelectric layer 15 can be prevented. Thereby, the memory characteristics can be also improved.

Further, since the heat treatment for activating the impurities injected into the silicon substrate 11 and the heat treatment for crystallizing the ferroelectric layer 15 are performed in a step, the manufacturing process is simplified and heat damage given to the silicon substrate 11 is reduced. Thereby, the operation characteristics of the ferroelectric memory device can be also improved.

A ferroelectric memory device manufactured according to this embodiment has a feature that the end faces of the stacked layers constituting the gate structure section 20 are continuous. On the other hand, according to the conventional method described above with reference to FIG. 5 or FIG. 6, it is impossible to manufacture a ferroelectric memory device provided with gate structure sections each including a ferroelectric layer and having straight end faces. That is, according to methods for manufacturing a ferroelectric memory device ever known, it is impossible to form the gate structure section 20 having continuous end faces (side faces) and satisfactorily maintain the characteristics of the ferroelectric layer 15, unlike the abovementioned embodiment.

Figure 2:
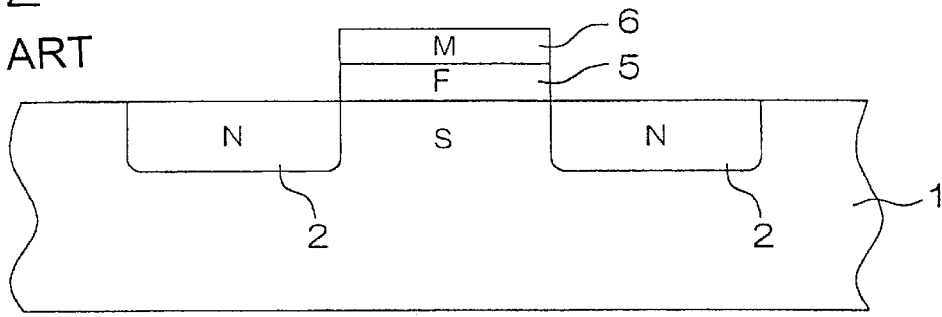
FIG. 2 is a schematically sectional view showing the structure of a MFS type ferroelectric memory element which is the most basic structure of a ferroelectric memory device.
Figure 3:
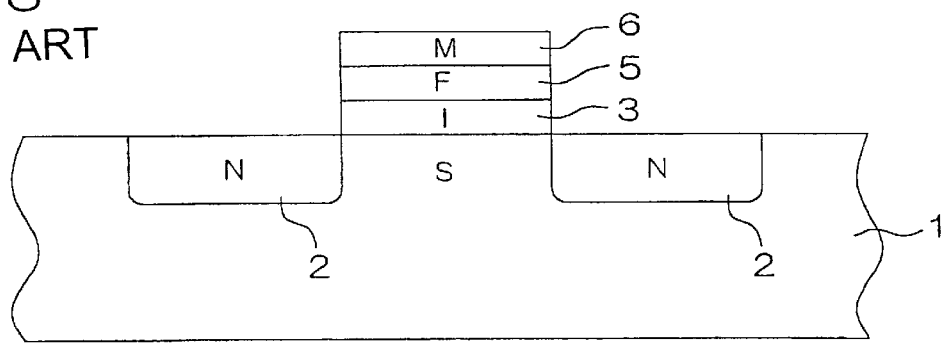
FIG. 3 is a schematically sectional view for explaining the structure of a ferroelectric memory element having a MFIS type gate structure.
Figure 4:
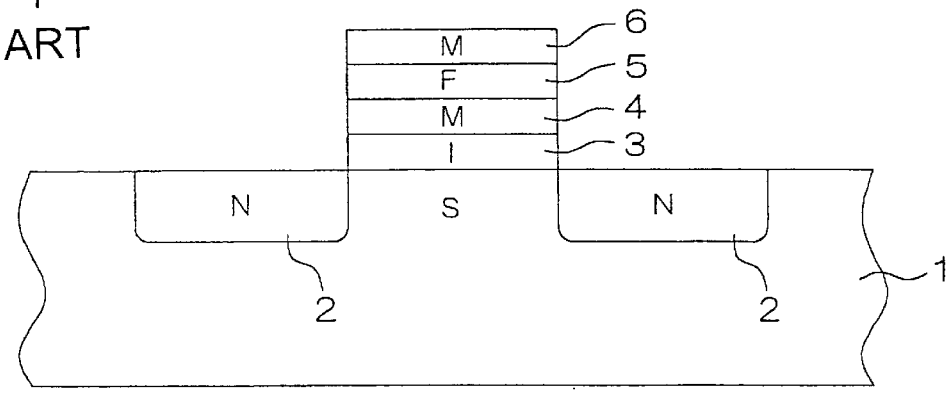
FIG. 4 is a schematically sectional view for explaining the structure of a ferroelectric memory element having a MFMIS type gate structure.

An embodiment of the present invention has been described above, but the present invention can be embodied in another form. For example, a method of manufacturing a ferroelectric memory device having gate structure sections of MFMIS type has been described in the abovementioned embodiment, but the present invention can be applied to a method of manufacturing a ferroelectric memory device having gate structure sections of MFS type shown in FIG. 2 or having gate structure sections of MFIS type as shown in FIG. 3. In either of these cases, it is preferable that a metal layer and a ferroelectric layer are patterned using a common mask layer and a pair of impurity diffused layers are formed in a self-aligning manner with respect to the patterned and formed gate structure section. Further, it is preferable to perform the activation of the impurity diffused layers and the crystallization of the ferroelectric layer in a common step of adequate annealing such as lamp annealing.

Whichever structure is adopted as a gate structure section, at least a metal layer and a ferroelectric layer patterned using a common mask layer have continuous end faces.

Further, though a pair of N-type impurity diffused layers are formed with the gate structure section 20 interposed therebetween in the abovementioned embodiment, a ferroelectric memory device can be manufactured in which a pair of P-type impurity diffused layers are formed with the gate structure section 20 interposed therebetween to constitute a memory cell by a P-channel type transistor. In this case, boron ions, for example, as the P-type impurity ions are injected into the silicon substrate 11 in the step shown in FIG. 1C.

Further, in the abovementioned embodiment, the gas is changed over in etching each of the layers constituting the gate structure section 20. However, if the etching uniformity in a wafer surface is favorable, all of the layers constituting the gate structure section 20 can be etched using a gas including e.g. chlorine or HBr without changing over the gas.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No. 2000-47782 filed in the Japanese Patent Office on Feb. 24, 2000, the entire disclosure of which is incorporated herein by reference.

What is claimed is:

1. A method of manufacturing a ferroelectric memory device comprising the steps of:

stacking a ferroelectric layer and a conductor layer on a semiconductor substrate in order, forming a gate structure section including the ferroelectric layer and the conductor layer by patterning the ferroelectric layer and the conductor layer through etching using a common mask layer, introducing impurities into a pair of regions spaced apart from each other with the gate structure section interposed therebetween in a surface layer section of the semiconductor substrate in a self-aligning manner with respect to the gate structure section, and annealing simultaneously both of the ferroelectric layer and the impurities introduced into the semiconductor substrate to crystallize the ferroelectric layer and at the same time activate the impurities, thereby to form a pair of impurity diffused layers in the pair of regions respectively.

2. A method of manufacturing a ferroelectric memory device as claimed in claim 1, further comprising a step of forming an insulating layer on the semiconductor substrate before forming the ferroelectric layer, the gate structure section being formed on the insulating layer.

3. A method of manufacturing a ferroelectric memory device as claimed in claim 1, in which the annealing includes lamp annealing.

4. A method of manufacturing a ferroelectric memory device as claimed in claim 3, in which the time period and the temperature of the lamp annealing are determined on the basis of the material constituting the ferroelectric layer and the distance between the pair of the impurity diffused layers.

5. A method of manufacturing a ferroelectric memory device as claimed in claim 3, in which the impurity diffused layers form a shallow junction.

6. A method of manufacturing a ferroelectric memory device as claimed in claim 3, in which the lamp annealing is performed in an oxygen atmosphere.

7. A method of manufacturing a ferroelectric memory device as claimed in claim 3, in which the lamp annealing is performed in a nitrogen atmosphere.

8. A method of manufacturing a ferroelectric memory device as claimed in claim 3, in which the lamp annealing is performed in an atmosphere of a mixed gas of nitrogen and oxygen.

* * * * *